(12) United States Patent
Cutler

(10) Patent No.: US 8,299,655 B2
(45) Date of Patent: Oct. 30, 2012

(54) METHOD AND APPARATUS FOR AN OPTICAL FREQUENCY RECTIFIER

(75) Inventor: Paul H. Cutler, State College, PA (US)

(73) Assignee: Scitech Associates Holdings, Inc., State College, PA (US)

( * ) Notice: Subject to any disclaimer, the term of this patent is extended or adjusted under 35 U.S.C. 154(b) by 0 days.

(21) Appl. No.: 12/973,262

(22) Filed: Dec. 20, 2010

(65) Prior Publication Data

US 2011/0163920 A1 Jul. 7, 2011

Related U.S. Application Data

(60) Provisional application No. 61/335,201, filed on Jan. 4, 2010.

(51) Int. Cl.
*H01Q 1/26* (2006.01)
(52) U.S. Cl. .................. 307/151; 136/255; 136/256
(58) Field of Classification Search ............ 307/151; 136/255, 256
See application file for complete search history.

(56) References Cited

U.S. PATENT DOCUMENTS

| | | | |
|---|---|---|---|
| 7,345,296 | B2 | 3/2008 | Tombler, Jr. et al. |
| 7,799,988 | B2 | 9/2010 | Cutler |
| 8,115,683 | B1 | 2/2012 | Stefanakos et al. |
| 2005/0104085 | A1 | 5/2005 | Pinkerton et al. |
| 2005/0212395 | A1 | 9/2005 | Anazawa et al. |
| 2008/0053952 | A1 | 3/2008 | Okada et al. |
| 2011/0100440 | A1* | 5/2011 | Schmidt et al. ........... 136/255 |

FOREIGN PATENT DOCUMENTS
WO WO 2009023778 A1 * 2/2009

OTHER PUBLICATIONS

Carver and Mink, Microstrip Antenna Technology, IEEE Transactions on Antennas and Propagation, vol. AP-29, No. 1, Jan. 1981, pp. 2-24.
Kempa, etc., Carbon Nanotubes as Optical Antennae, Advanced Materials 2007, pp. 421-426.
Mayer, Chung, Weiss, Miskovsky and Cutler, Three-Dimensional analysis of the geometrical rectifying properties of asymmetric metal-vacuum-metal junctions and extension for energy conversion, Physical Review B 77 085411 (2008), pp. 1-11.

(Continued)

*Primary Examiner* — Fritz M Fleming
(74) *Attorney, Agent, or Firm* — Andrew F. Young, Esq.; Lackenbach Siegel, LLP

(57) ABSTRACT

The present invention is a method and apparatus for receiving and converting incident radiation into DC current. The method begins with selection of an antenna having a terminal tip with a sharp edge. The antenna is layered with a substrate and a first coating. A first electrode and a metallic/mCNT antenna are layered on the first coating, and a plasmonic layer is then added. A gap is formed which is bounded on one side by the terminal ends of the plasmonic layer and the first coating, and a second electrode and a second coating on the other. The second electrode is layered upon the second coating which is layered upon the substrate. A set of AC currents is induced along the length of the antenna. The method then calculates whether or not the induced AC currents are large enough to create voltages for field emission. If the voltages are large enough, then a forward bias and a reverse bias are initiated. Due to the asymmetry in these tunneling barriers, a positive net DC current is delivered to an external circuit.

26 Claims, 13 Drawing Sheets

OTHER PUBLICATIONS

Sullivan, Kuk and Cutler, Proposed Planar Scanning Tunneling Microscope Diode: Application as an Infrared and Optical Detector, IEEE Transactions on Electron Devices, vol. 36, No. 11, Nov. 1989, pp. 2659-2664.

Nguyen, Cutler, etc., Mechanisms of Current Rectification in an STM Tunnel Junction and the Measurement of an Operational Tunneling Time, IEEE Transactions on Electron Devices, vol. 36, No. 11, Nov. 1989, pp. 2671-2678.

Gupta and Willis, Nanometer spaced electrodes using selective area atomic layer deposition, Applied Physics Letters 90, 253102 (2007), pp. 1-3.

Bharadwaj, Deutsch and Novotny, Optical Antennas, Advances in Optics and Photonics 1, (2009), pp. 438-483.

Alda, Rico-Garcia, Lopez-Alonso and Boreman, Optical antennas for nano-photonic applications, IOP Publishing Ltd., 2005, pp. S230-S234.

Kotter, Novack, Slafer & Pinhero, Solar Nantenna Electromagnetic Collectors, 2008 by ASME, ES2008-54016, pp. 1-7.

Nguyen, Experimental and Theoretical Studies of Tunneling Phenomena Using Scanning Tunneling Microscopy and Spectroscopy, A Thesis in Physics, The Pennsylvania State University, May 1989, pp. 1-216.

International Search Report for PCT/US2011/061843 mailed Jan. 5, 2012, 9 pages.

* cited by examiner

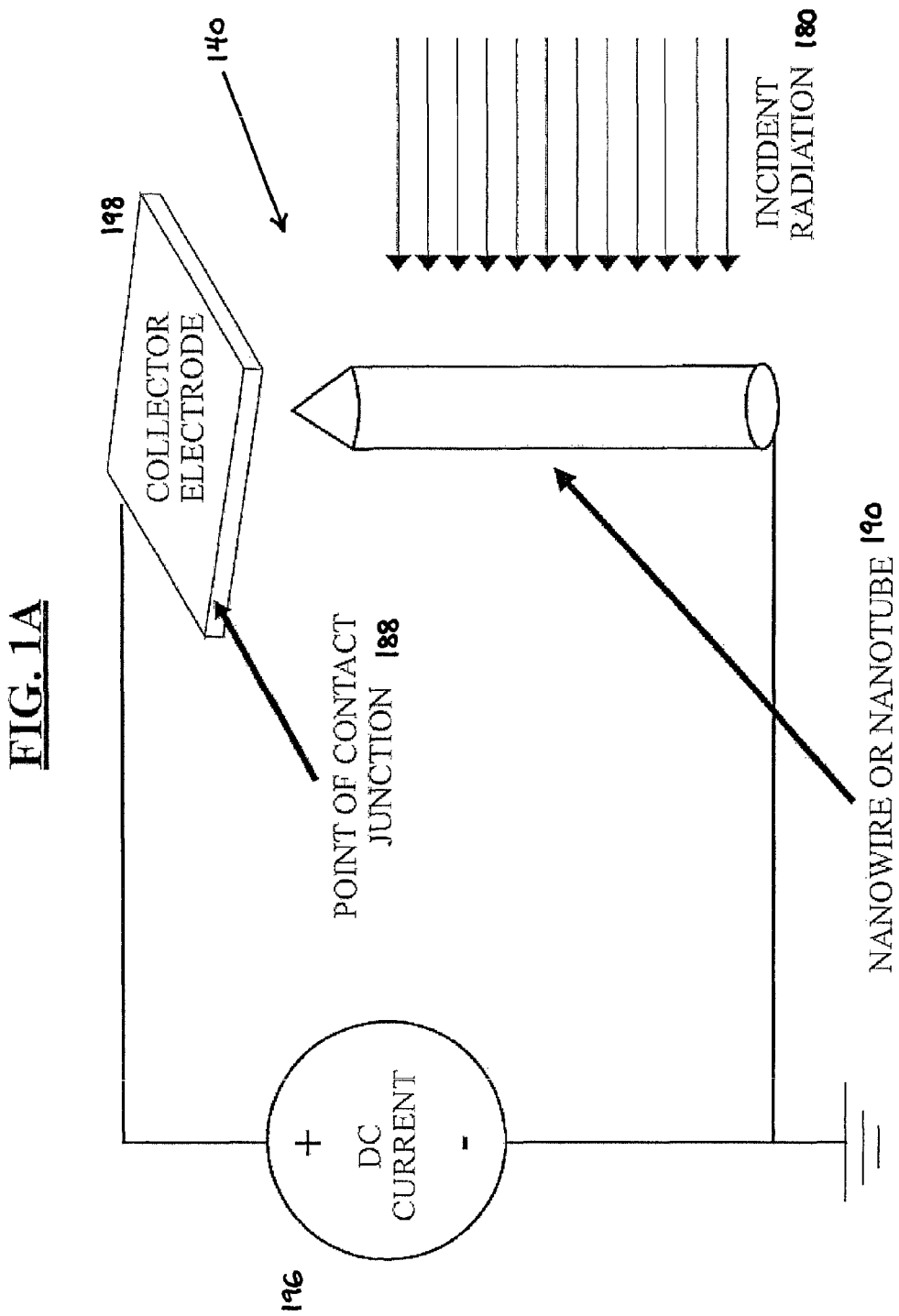

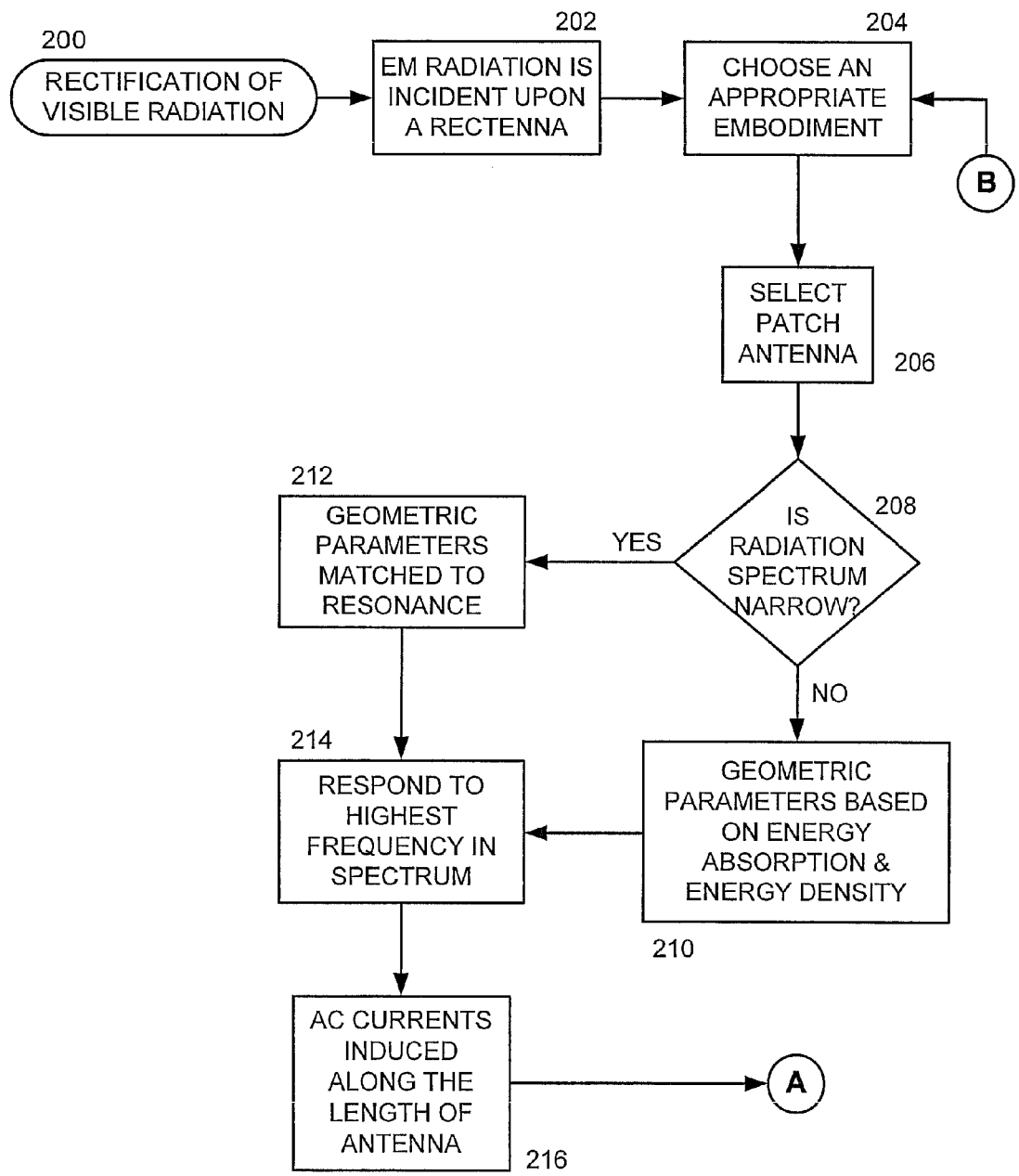

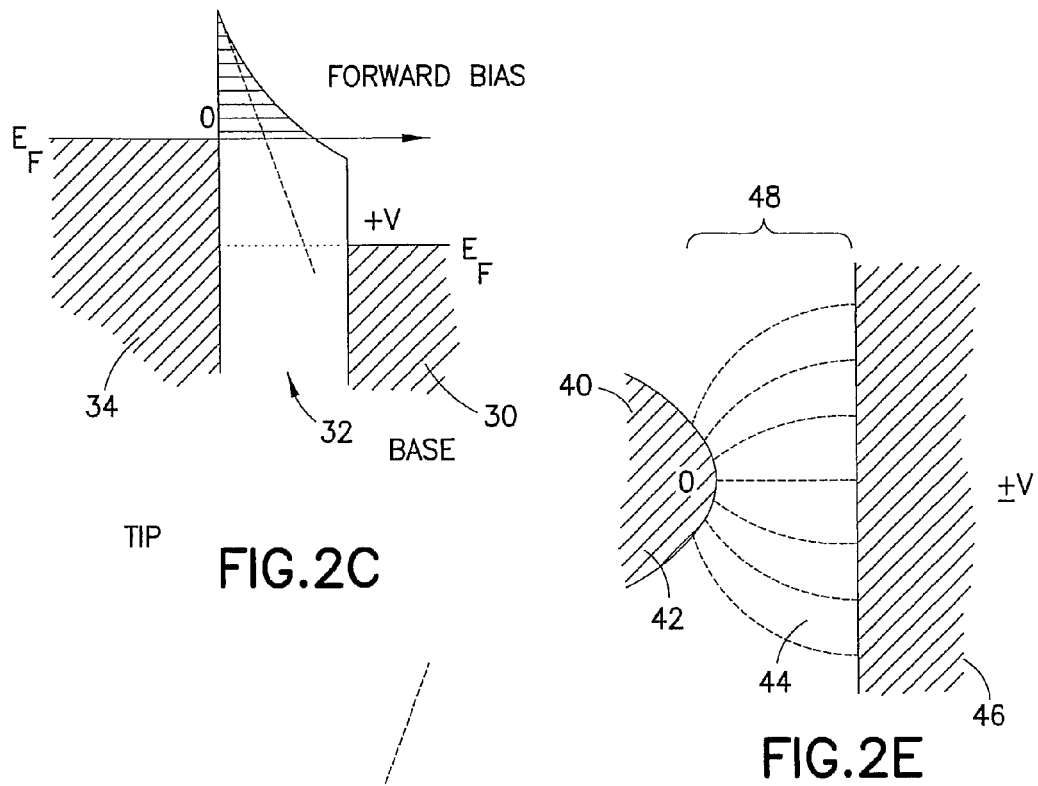

METHOD AND APPARATUS FOR AN OPTICAL FREQUENCY RECTIFIER

CROSS REFERENCE TO RELATED APPLICATIONS

This application claims priority from U.S. Provisional Patent Application Ser. No. 61/335,201, filed Jan. 4, 2010, the entire contents of which is herein incorporated fully by reference.

This application is related to U.S. Pat. No. 7,799,988 for an Apparatus And System For A Single Element Solar Cell, which issued Sep. 21, 2010 to the inventor hereof.

FIGURE FOR PUBLICATION

FIG. 1A.

BACKGROUND OF THE INVENTION

1. Field of the Invention

The present invention relates to a technique for performing optical frequency rectification so as to more efficiently harvest radiation from the infrared to the visible. More specifically, the present invention relates to a technique of optical frequency rectification based on a geometric asymmetry of the antenna tip, or other shaped edges such as on patch antennas.

2. Description of the Related Art

The uses of rectennas for power transmission and detection, in the microwave region, have a long history. Applications have included: long distance power beaming; signal detection; and, wireless control systems. The first receiving device for efficient reception and rectification of microwave power was developed in the early 1960's.

Point-contact devices (i.e., whisker diodes) have been used in measurements of absolute frequencies up to the green part of the visible spectrum, demonstrating a response time in the order of femto-seconds, which is orders of magnitude faster than with conventional MIM diodes. In addition to the nanowire geometry for the whisker antennas, the use of patch antennas (e.g. microstrip antenna) can have extended solid and open geometries (e.g. squares, rectangles, rings or others) which provide a more robust stability in a practical device.

In addition, the patch antenna can lead to enhanced antenna properties and output (see K. R. Carver and J. W. Mink, IEEE Trans. Antennas and Prop, AP-29, 1, 2 (1981)). Moreover, such antenna arrays of gold have been fabricated on flexible substrates at the Idaho National Laboratory. The planar structure should require simpler fabrication. The technological difficulty of producing arrays of nanometer gap junctions has recently been overcome by Gupta and Willis using atomic layer deposition (ALD). Planar arrays of Cu-vacuum-Cu tunnel junctions were produced on silicon wafers using conventional lithography techniques, followed by ALD to yield tunnel junctions of ~1 nm.

Recent 3-D quantum mechanical computer simulations of optically irradiated MVM tunnel junctions using Ag, Au and Cu tips predict an enhanced rectification and current output due to the surface plasmonic resonances in these materials at ~3 eV, corresponding to the energetic green portion of the visible spectrum. Deposition of a thin layer of these metals on an underlying antenna structure such as tungsten, molybdenum or aluminum should yield the same results.

Unlike a conventional planar MIM diode, the rectification process, in the proposed device can be due solely (and/or primarily) to the geometrical asymmetry of the pointed nanowires/mCNTs tip. A razor like edge, produced on a microstrip or other form of patch antenna, can also provide the intrinsic geometric asymmetry necessary for the rectification process.

One of the major challenges in the efficient harvesting of the energy in the optical frequency portion of the spectrum is the development of a broadband device that will rectify from the infrared (IR) through the visible portion of the spectrum ~$10^{15}$ Hz, comprising the largest portion of the solar energy spectrum. Currently silicon based energy conversion devices (photovoltaic) are narrow band devices limiting the collection to a lower energy portion of the electromagnetic spectrum.

This technique for optical frequency rectification has applications that includes but are not limited to photovoltaics (the conversion of photon energy to electrical energy), solar cells which convert solar energy to electrical (see U.S. Pat. No. 7,799,988, for an APPARATUS AND SYSTEM FOR A SINGLE ELEMENT SOLAR CELL, issued Sep. 21, 2010, to Paul H. Cutler (hereinafter referred to as Cutler); the entire contents of which is hereby incorporated by reference), thermal or chemical energy, nano-photonics, near field optics, IR sensing and imaging including medical and chemical sensors (see *Optical antennas for nano-photonic applications*, J. Alda, J. Rico-García, J. López-Alonso, and G. Boreman, Nanotechnology, vol. 16, pp. S230-4, 2005; and, *Optical Antennas*, Palash Bharadwaj, Brad Deutsch, and Lukas Novotny, Adv. Opt. Photon. 1, 438-483). An additional application is the optical frequency transmission and receiving of information and energy conversion. This is significant since the density of transmitted information is greater at higher frequencies; in fact the density goes as the square of the frequency. For transmission through the atmosphere, losses decrease as the frequency increases Thus, one of the fundamentally important and critical aspects for harvesting is the ability to achieve optical rectification into the visible portion of the electromagnetic spectrum. With current rectification devices the fastest frequency response is limited to the ER. We have developed a new paradigm for optical rectification and have demonstrated both theoretically and experimentally the feasibility for a long sought practical rectification device in the visible portion of the electromagnetic spectrum.

The prior art has attempted to address a number of the issues raised hereinabove. For instance, U.S. Pat. No. 4,445,050 for a DEVICE FOR CONVERSION OF LIGHT POWER TO ELECTRIC POWER, which issued Apr. 24, 1984 to Alvin M. Marks (hereinafter referred to as Marks-1), proposed a device for the direct conversion of light power to electrical power. The present invention differs from that of Marks-1, in that Marks-1 utilizes a plurality of dipole antennae for absorbing light photons. An alternating electric field of the light photons is employed to cause electrons in the dipole antenna to resonate and absorb electrical power. The DC power is accumulated on conducting busbars from the plurality of antennae and associated rectifying circuits.

Additionally, U.S. Pat. No. 4,720,642 for a FEMTO DIODE AND APPLICATIONS, which issued Jan. 19, 1988 to Marks (hereinafter referred to as Marks-2), discloses a femto-second rectifying device consisting of a sub-micron sized dipole antenna attached to a MIM diode at one end. The Marks-2 device is a traditional planar MIM diode that relies on material choices and not geometry. It is important to note in the MIM rectifying device of Marks-2, the response time of the device will be limited by the choice of materials and does not extend beyond the IR.

Further, U.S. Pat. No. 4,574,161 for an ORDERED DIPOLAR LIGHT-ELECTRIC POWER CONVERTER, which issued Mar. 4, 1986 to Marks (hereinafter referred to as Marks-3), teaches a light to electric power converter comprising a sheet with light-absorbing electrically conducting particles embedded therein. The particles can be metallic, or can be a conductive molecule such as a conjugate carbon chain. The electrodes of Marks-3 are formed in-situ and comprise a salt reduced to a metal, and forming a pre-determined pattern.

What is not appreciated by the prior art is that current silicon based energy conversion devices (photovoltaic) are narrow band devices limiting the collection and conversion to a lower energy portion of the spectrum. In general, conventional rectennas consist of two distinct elements, a dipole antenna plus a separate rectifying device such as an MIM or Schottky diode. Thus, one of the fundamentally important and critical aspects for harvesting is the ability to achieve optical rectification into the visible portion of the solar spectrum. With current rectification devices the fastest frequency response is limited to the IR.

Additionally, another shortcoming of the prior art is the problem of limited frequency response of conventional planar MIM diodes (limited by parasitic capacitance effects).

Cutler was able to address, in great part, the efficiency required for receiving and converting incident radiation into DC current. The present invention expands on the success of Cutler by addressing the need for an improved technique of optical rectification for photovoltaic and other applications based on geometric asymmetry of the antenna tip, or other shaped edges such as on patch antennas. Further, there is a need for the use of point-contact nanowires/mCNTs, and other sharp-edged devices such as patch antennae and their inherent fast response time, to overcome the problem of limited frequency response of conventional planar MIM diodes.

ASPECTS AND SUMMARY OF THE INVENTION

An aspect of the present invention is to provide an efficient and novel apparatus for converting radiation from the range including infra-red (IR) to the visible spectrum into a DC current.

Another aspect of the present invention is to provide a single element rectenna (i.e. a combination antenna and rectifying diode first used in the microwave region) made from nanowires, or other suitably shaped antenna or metallic carbon nanotubes (mCNTs).

Another aspect of the present invention is to provide a rectenna which acts simultaneously as both a receiving antenna and a point contact or sharp-edged rectifying device.

The present invention relates to a method and apparatus for receiving and converting incident radiation into DC current. More specifically, the present invention relates to a technique of optical frequency rectification based on a geometric asymmetry of the antenna tip, or other shaped edges such as on patch antennas. The method begins with selection of an antenna having a terminal tip. The tip has a sharp edge, and the antenna is capable of receiving the incident radiation. The rectenna consists of a receiving antenna (for example, a patch antenna or nanowire or mCNT) with one edge terminated by a tip or sharp edged structure which is part of a geometrically asymmetric tunnel junction.

According to an embodiment of the present invention there is provided a method and apparatus for receiving and converting incident radiation into DC current. The method comprises a number of steps that begin with choosing an appropriate embodiment for an antenna having a terminal tip. The tip has a sharp edge, and the antenna is capable of receiving the incident radiation. The antenna can be (is) layered so as to create the appropriate embodiment.

The layering comprises selecting a substrate and first layering a first coating on the substrate so that the first coating extends partway from a proximal edge of the substrate along its length; A first electrode is layered on the first coating so as to extend partway from a proximal edge of the first coating along the length of the first coating. A metallic antenna is then layered on the first coating so as to extend from a distal edge of the first electrode and along and exceeding beyond a distal edge of the first coating. The metal for the antenna is selected from the group comprising: tungsten; molybdenum; nickel; gold; aluminum; copper; and silver.

A plasmonic layer of gold, copper, silver or other appropriate material with the desired properties is then added on top of the metallic antenna so as to extend from a distal edge of the first electrode and along and exceed beyond a distal edge of the metallic antenna and extend downward at the distal end so as to cap the metallic antenna. A gap is formed which is bounded by the terminal ends of the plasmon layer and the first coating on the one hand, and a second electrode and a second coating on the other. The second electrode is layered upon the second coating, and the second coating, in turn, is layered upon the substrate.

A set of AC currents is induced along the length of the antenna. The method must then calculate whether or not the resultant induced AC voltages across the gap are large enough for a field emission. If the voltages are large enough, then a forward bias and a reverse bias are initiated based upon the geometric asymmetry at the antenna tip. A positive net DC current is then directed to an external circuit.

The above, and other aspects, features and advantages of the present invention will become apparent from the following description read in conjunction with the accompanying drawings, in which like reference numerals designate the same elements.

BRIEF DESCRIPTION OF THE DRAWINGS

FIG. 1A is a perspective view of a rectenna configured to provide asymmetry of the tunnel junction, wherein is shown a point-contact nanowire/mCNT junction (or sharp-edged patch antenna visualized more explicitly in FIG. 1B), with incident radiation.

FIG. 2A is a flowchart of the method of the present invention wherein EM radiation is incident upon an antenna.

FIG. 2C shows a representation of the tunneling junction of an exemplary embodiment of the present invention under forward bias.

FIG. 2D shows a representation of the tunneling junction of an exemplary embodiment of the present invention under reverse bias.

FIG. 2E shows a point-contact junction of the exemplary embodiment of the present invention, including the electric field lines.

DETAILED DESCRIPTION OF THE PREFERRED EMBODIMENTS

Figure 1B:
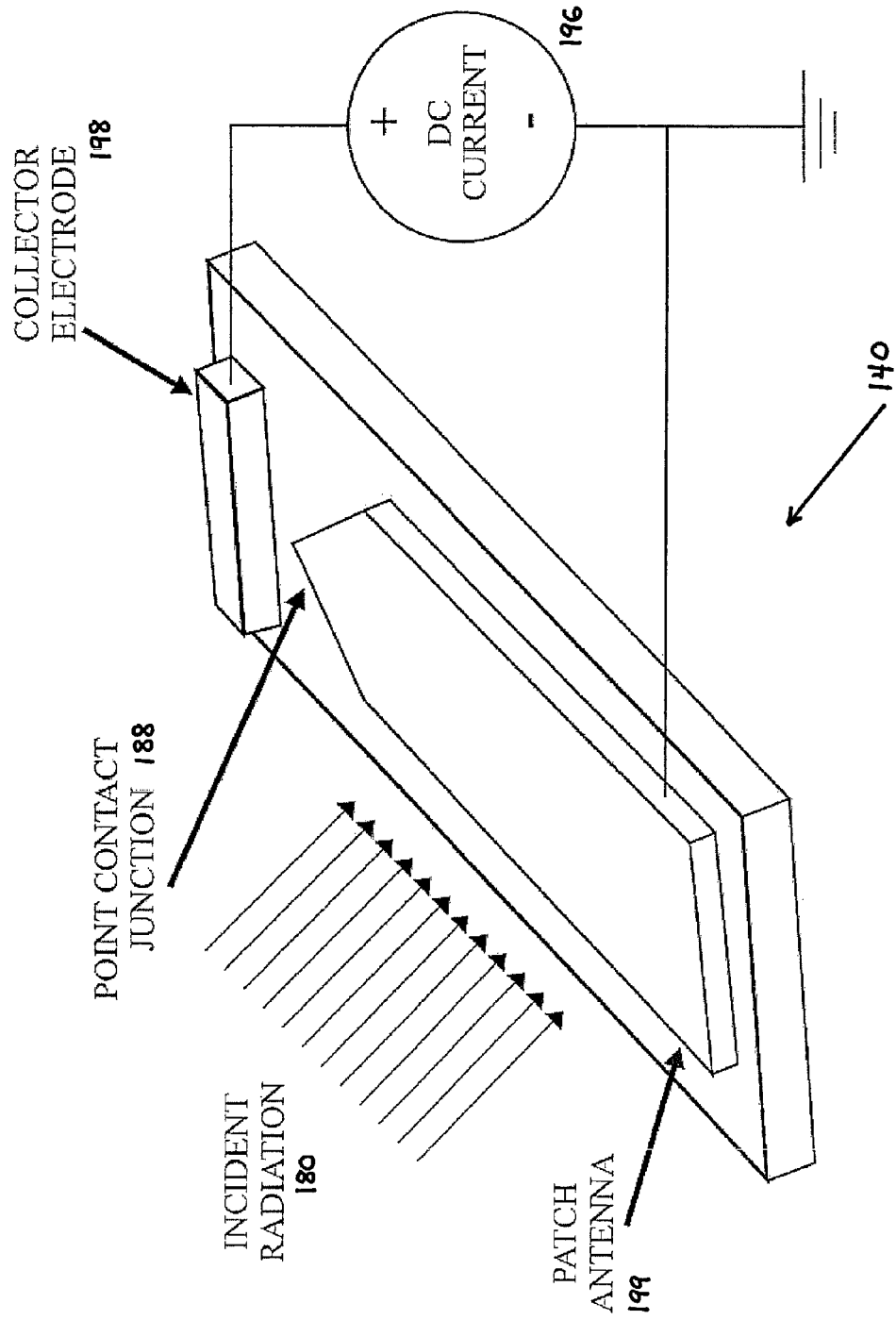
FIG. 1B is a perspective view of a rectenna configured to provide asymmetry of the tunnel junction, wherein is shown a sharp-edged patch antenna junction with incident radiation.

Reference will now be made in detail to several embodiments of the invention that are illustrated in the accompanying drawings. Wherever possible, same or similar reference numerals are used in the drawings and the description to refer to the same or like parts or steps. The drawings are in simplified form and are not to precise scale. For purposes of convenience and clarity only, directional terms, such as top, bottom, up, down, over, above, and below may be used with respect to the drawings. These and similar directional terms should not be construed to limit the scope of the invention in any manner. The words "connect," "couple," and similar terms with their inflectional morphemes do not necessarily denote direct and immediate connections, but also include connections through mediate elements or devices.

Turning first to FIGS. 1A and 1B, there are shown antennas capable of supporting the present invention. In the present invention, a single element acts as both a receiving antenna, and a rectifying device which has been demonstrated to have a response time into portions of the visible portion of the electromagnetic spectrum. In FIG. 1A, this point contact-like device consists of nanowires/mCNTs on planar substrates (see FIGS. 6 and 8). The present invention utilizes wavelength dependent sized vertical arrays of these point contact-like devices. In the proposed point contact device, the nanowire, or mCNT, forms an MVM, or MIM, junction barrier with a collecting electrode. Charge transport through the barrier occurs via tunneling. In FIG. 1B, the rectenna is a sharp-edged patch antenna with a rectifying tunneling junction.

With respect to FIGS. 1A and 1B, the rectenna device 140 has a plurality of nanowire/mCNTs 190. An external load 196 is connected to the rectenna 140 for utilizing and/or storing rectified DC current.

As photons from incident radiation 180 reach the nanowire/mCNT 190, it absorbs the photons. In the infrared and optical regions, where the length of the point-contact nanowire/mCNT 190 is several wavelengths larger (on the order of about 1-10 wavelengths larger) than the incident radiation 180, the nanowire/mCNT 190 will act as an efficient antenna when the nanowire/mCNT is equal to an appropriate length, such as a quarter of the wavelength of the incident radiation.

Appropriate selection of the diode antenna length, electrical conductivity, optical reflectivity and load impedance may be used to improve the receiving properties of the high frequency diode, and to optimize the power absorption, and therefore the intensity of the current emission, or correspondingly, the output power in the rectenna 140.

The energy absorbed by the nanowire/mCNT 190 causes electronic charge carriers to move to the sharp edge of the nanowire/mCNT 190, and this charge sets up an AC voltage in the nanowire/mCNT 190. The geometric asymmetry of the point-contact junction 188 causes a rectification of the AC current passing through the tunneling junction. Once the current has been rectified, the transparent conductive layer of the collector electrode 198 collects the rectified DC current. From the collector electrode 198, the DC current is coupled to an external load 196 to use and/or store the usable energy. In this manner, the metallic nanowire/mCNT 190 acts as a receiving antenna to absorb the radiation, generating an alternating voltage in the nanowire/mCNT 190, which is then rectified in the point-contact junction 188 to create a DC voltage.

FIG. 2A is a flowchart of the method of the present invention wherein EM radiation is incident upon an antenna.

The method flow begins at step 200 wherein the rectification of visible radiation is initiated. From step 200, the method flows to step 202 where the incident radiation is directed to a rectenna. The rectenna consists of a receiving antenna (for example, a patch antenna characterized by its three primary dimensions) with one edge terminated by a tip or sharp edged structure which is part of a geometrically asymmetric metal vacuum/metal junction (with a gap distance s) for the radiation collected by the antenna.

The selection of an appropriate embodiment such as a patch antenna, whisker antenna, or rectenna with a sharp edge coating (such as diamond, BN, GaN, AlN, AlGaN and Cs) is made at step 204. The coating reduces the magnitude of the forward tunneling barrier allowing for enhanced electron emission. In addition to the nanowire geometry employed by whisker antennas, other embodiments use patch antennas, which operate into the IR and higher frequencies and can have extended solid and open geometries (e.g. squares, rectangles, any n-sided structure or others). These rectenna devices provide a more robust stability.

Furthermore, patch antennas do lead to enhanced operational antenna properties and output. Such antenna arrays of gold have been fabricated on flexible substrates at the Idaho National Laboratory. The technological difficulties of producing arrays of nanometer gap junctions have recently been overcome by using atomic layer deposition (ALD). Planar arrays of Cu-vacuum-Cu tunnel junctions have been produced on silicon wafers using conventional lithography techniques, followed by ALD to yield tunnel junctions of ~1 nm. (see R. Gupta and B. G. Willis, *Appl. Phys Lett.* 90, 253102 (2007).

From step 204, the method flow advances to step 206 where the antenna is established before advancing to the query at step 208.

At step 208, the flow queries as to whether or not the radiation spectrum is narrow. If the response to the query is "YES", then the method flow advances to step 212 where the geometric parameters are matched to the resonance to determine a peak wavelength. From step 212, the method flow advances to step 214. If, however, the response to the query at step 208 is "NO", then the flow advances to step 210 where the geometric parameters are based on energy absorption and energy density before the flow advances to step 214.

At step 214, the gap is small enough to respond to the highest frequency in the spectrum presented by the incident radiation. The gap distance is designed so tunneling time is sufficient for electrons to transit the barrier before field reversal. Nanowire/mCNTs and other sharp edged geometry devices have an inherent fast response time (up to a fermosecond). The rectenna devices use wavelength dependent sized arrays of these rectennas. In the rectenna device, the nanowire/mCNT or other embodiments forms a point contact or sharp edged MVM or MIM junction barrier with a collecting electrode. Charge transport through the barrier is via tunneling. The problem of limited frequency response of conventional planar MIM diodes due to parasitic capacitance effects is overcome by the use of these reduced area point-contact nanowires/mCNTs, or sharp-edged devices.

From step 214, the method flow advances to step 216 where AC currents are induced along the length of the antenna. The flow then advances along path A to re-enter the method flow at step 218 as is shown in FIG. 2B.

Figure 2B:
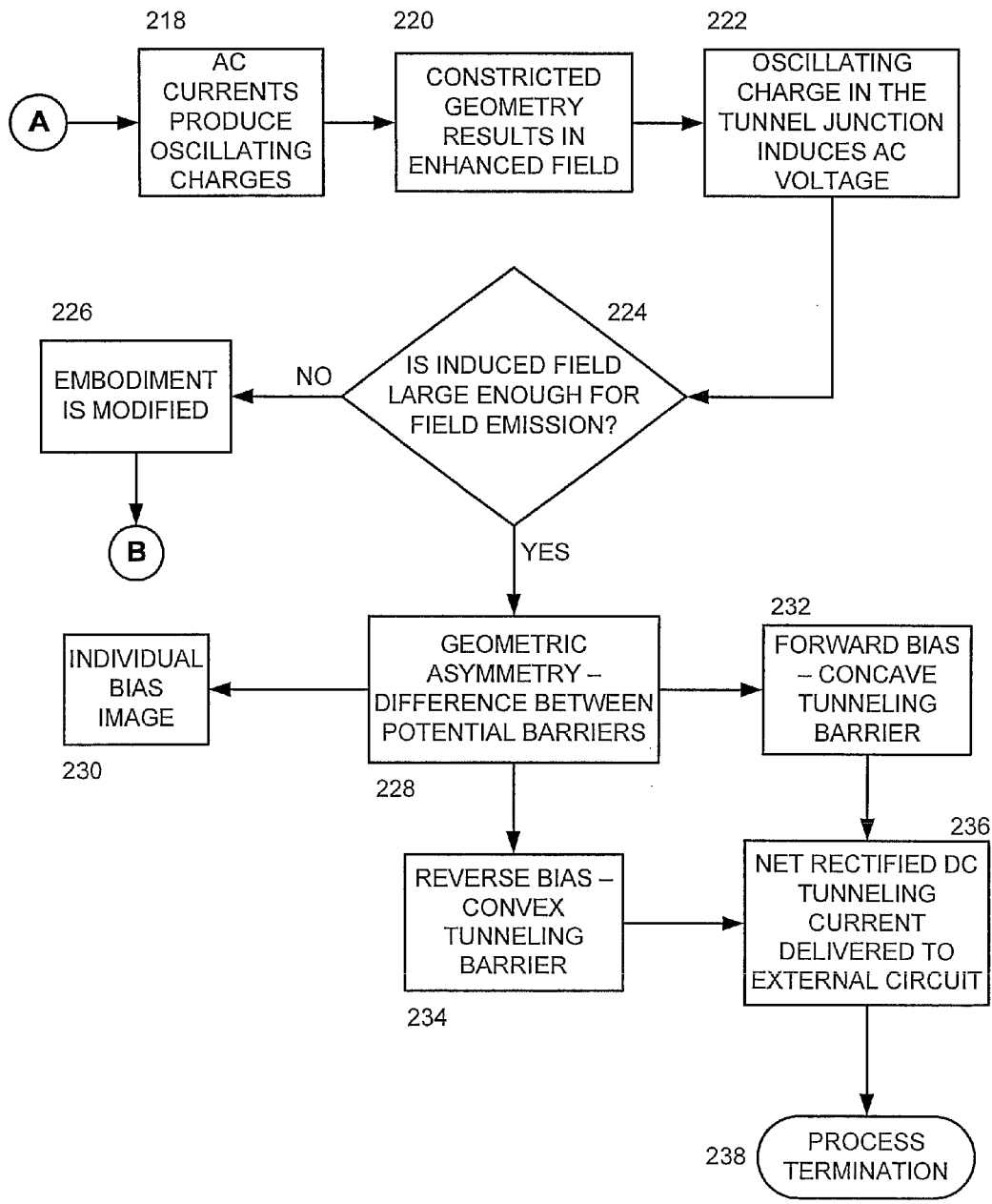
FIG. 2B is a continuation of the flowchart of FIG. 2A.

Turning to FIG. 2B, there is shown a continuation of the flowchart of FIG. 2A where path A advances to step 218. At step 218, the AC currents produce oscillating charges at the top or edge of the geometrically asymmetric tunneling junction which, at step 220, results in an enhanced field due to the constricted geometry of the tip or edge. The oscillating charge in the tunnel junction induces, at step 222, an AC voltage across the gap.

The method flow advances from step 222 to the query at step 224, which asks if the induced field is large enough for a field emission. If the response to the query is "NO", then the embodiment is modified at step 226 before moving along path B to re-enter the method flow at step 204 as is shown in FIG. 2A. However, if the response to the query at step 224 is "YES", then the flow advances to step 228 where, due to geometric asymmetry, there is a difference between the potential barriers for forward and reverse bias which results in rectification.

From step 230, the method flow takes a "bias reference" at step 230 before advancing to either step 232 or step 234 depending upon whether or not the bias is forward or reverse. The bias reference at step 230 can be seen by looking at FIGS. 2C, 2B and 2D (further discussed hereinbelow).

At step 232, a forward bias results in a field enhancement at the tip or edge protrusion relative to a counter electrode which results in a concave barrier compared to a uniform field case. At step 234, a reverse bias results in a geometrically required fall-off of the field at the tip which further results in a convex barrier compared to the uniform field case.

A planar geometry has a rectification ratio of 1. At step 232, the forward bias results in a concave potential barrier whereas at step 234, the potential barrier is convex which leads to an asymmetry in the forward and reverse tunneling currents and hence a rectification ratio greater than 1. The rectification process can, of course, be enhanced by a temperature or material asymmetry and other geometric factors.

From steps 232 and 234, the method flow advances to step 236 where the forward current exceeds the reverse current so that a net DC current and power is delivered to the external circuit. The method flow is then terminated at step 238.

Rectification in a nanowire/mCNT point contact diode 140 results from the geometric asymmetry of the diode structure as well as the utilization of dissimilar materials. This geometric asymmetry is shown in FIG. 2C and in FIG. 2D, where, for an applied electric bias, the currents in the forward and reverse direction (even for identical metals) are not equal because geometrically induced asymmetric tunneling barriers lead to asymmetric forward and reverse tunneling currents. As shown in FIGS. 2C and 2D, for the forward bias, the concave potential barrier 32 is not symmetrical with the reverse bias convex potential barrier 36 between the edge 34 and the base 30. This rectification may be further enhanced by providing material asymmetry, of the edge 34 and base 30, and by changing other physical parameters of the junction, such as the edge radius and the edge-base (anode) spacing. This is experimentally confirmed by measuring the I-V characteristics of an STM, which is just a point-contact diode with atomic scale control of the vacuum spacing in the junction.

FIG. 2E shows the point-contact junction, having a thin insulating/vacuum layer 48 situated between the nanowire/mCNT 40 (having sharp edge 42) and a metal electrode 46. The dashed lines 44 represent the electric field in the point-contact junction. This structure allows the propagation of incident radiation-induced surface currents along the length of the nanowire/mCNT 140 with small attenuation. A surface charge accumulates at the edge 42, induced by the absorbed solar radiation. This charge distribution sets up an AC bias voltage between the edge 42 and the metal electrode layer 46 (that is, the anode, or transparent conductive layer).

Figure 3:
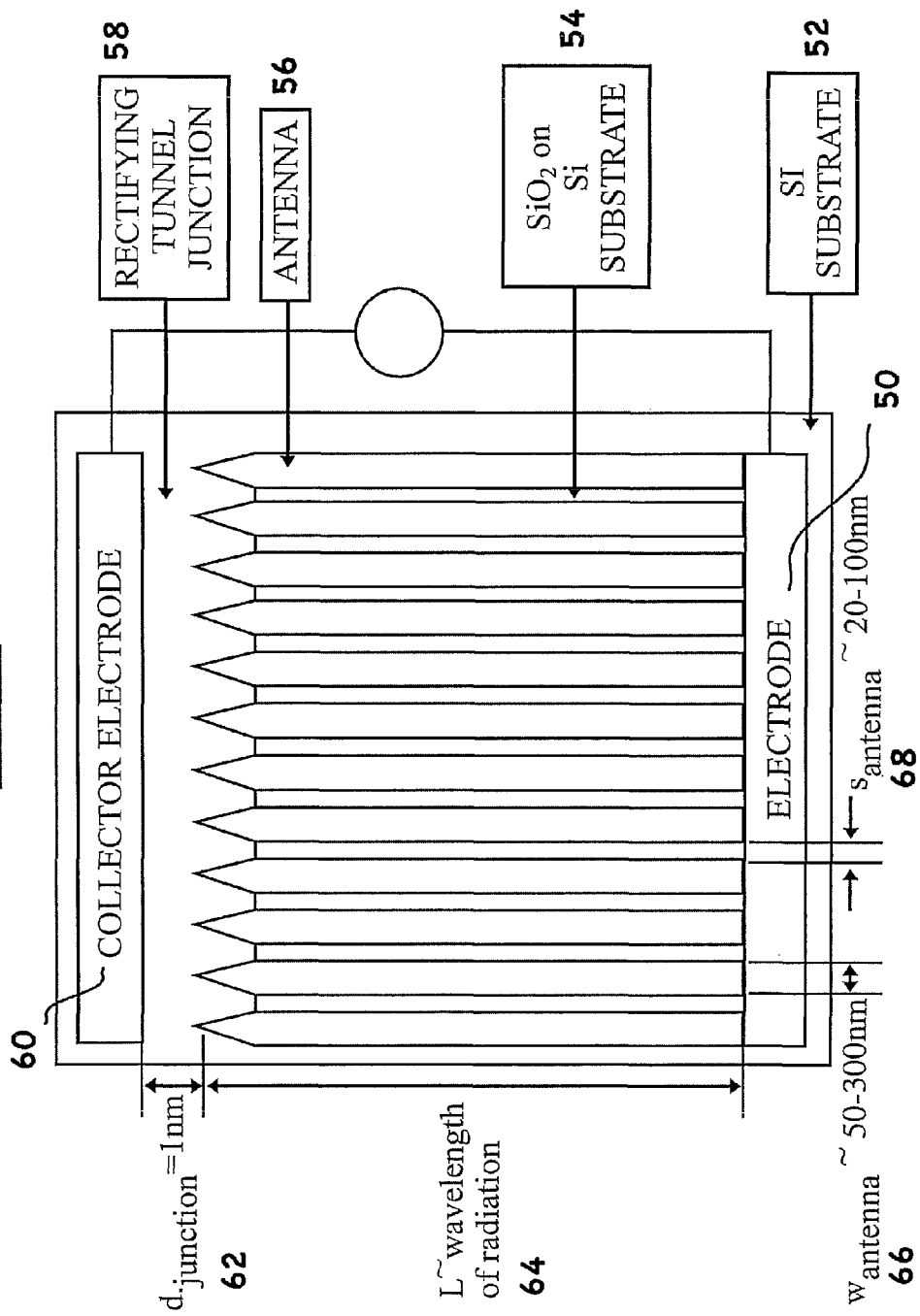
FIG. 3 is a block diagram of the electrode and collector electrode assembly of the rectenna of FIG. 1, using a patch antenna.

Turning to FIG. 3 there is shown a block diagram of the electrode and collector electrode assembly of the antenna 56. This point contact-like device consists of patch antennae or horizontally oriented nanowires/mCNTs on planar substrates. The present invention utilizes wavelength dependent sized patch antenna forms or horizontally oriented nanowires/mCNTs of these point contact-like devices. In the proposed point contact device, the patch antenna or the nanowire, or mCNT, forms an MVM, or MIM, junction barrier as a collecting electrode 60. Charge transport through the barrier occurs via tunneling at the rectifying tunnel junction 58 having a junction distance illustrated at 62.

The series of antennas 56 are anchored by the electrode 50 and are deposited on $SiO_2$ at 54 on a substrate Si at 52 and have a pre-determined wavelength of radiation 64. The antenna 56 width 66 is within the range of approximately 50-300 nm, while the $SiO_2$ on substrate at 54 has a width of approximately 20-100 nm.

Figure 4:
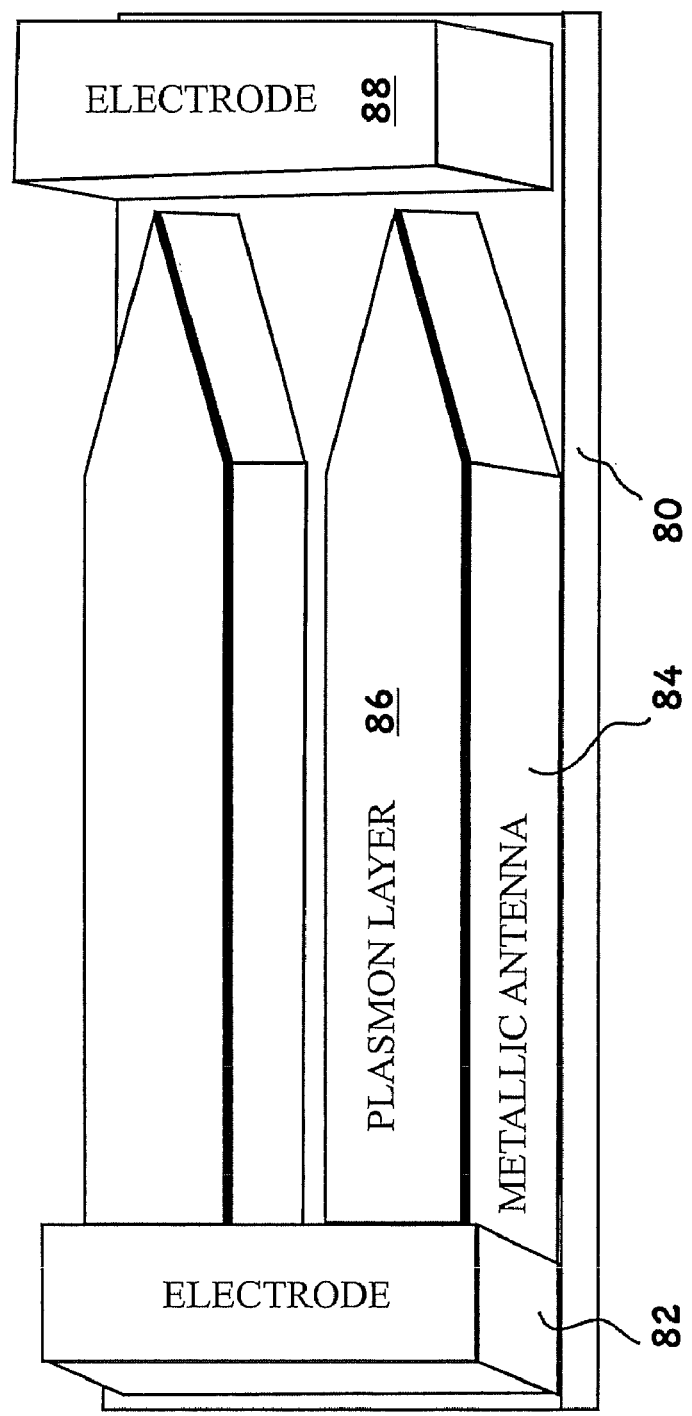
FIG. 4 is a block diagram of the electrode-to-electrode flow of the rectenna of FIG. 1, using a patch antenna.

FIG. 4 is a block diagram of the electrode-to-electrode flow of the antenna 56 of FIG. 3. The electrode 82 is layered on substrate 80 and joins the metallic antenna 84 which is coated with a Plasmon layer. The charge transport through the barrier is directed to the collecting electrode 88.

Figure 5:
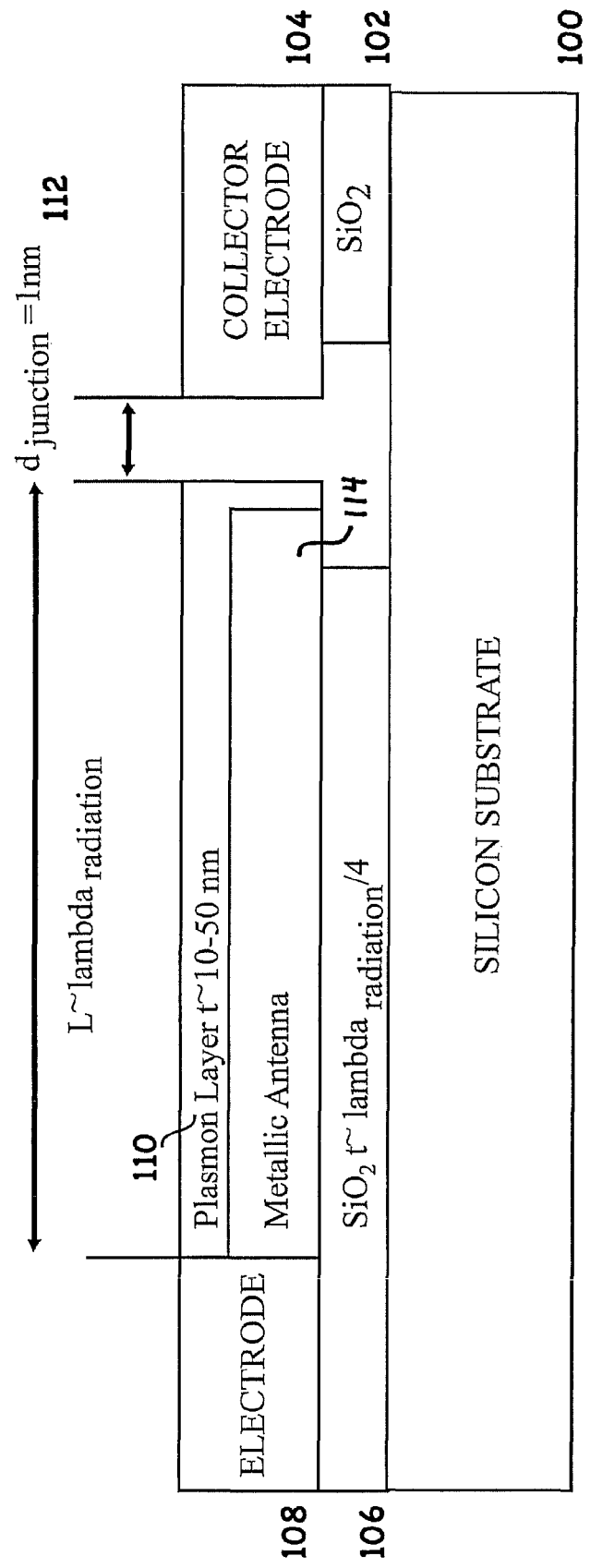
FIG. 5 is a side view of the antenna tip and illustrating the layered substrates of the present invention using a patch antenna.

In a variation of the perspective of FIGS. 3 and 4, FIG. 5 is a side view of the antenna tip and illustrating the layered substrates of the present invention. The electrode 108 is layered on the $SiO_2$ coating 106 of substrate 100 and abuts the metallic antenna 114 which is coated with a Plasmon layer 110. The junction gap 112 lies between the Plasmon layer 110 and the collector electrode 104. The charge transport through the barrier is directed to the collecting electrode 104 which is situated on top of an $SiO_2$ coating 102 of substrate 100.

Figure 6:
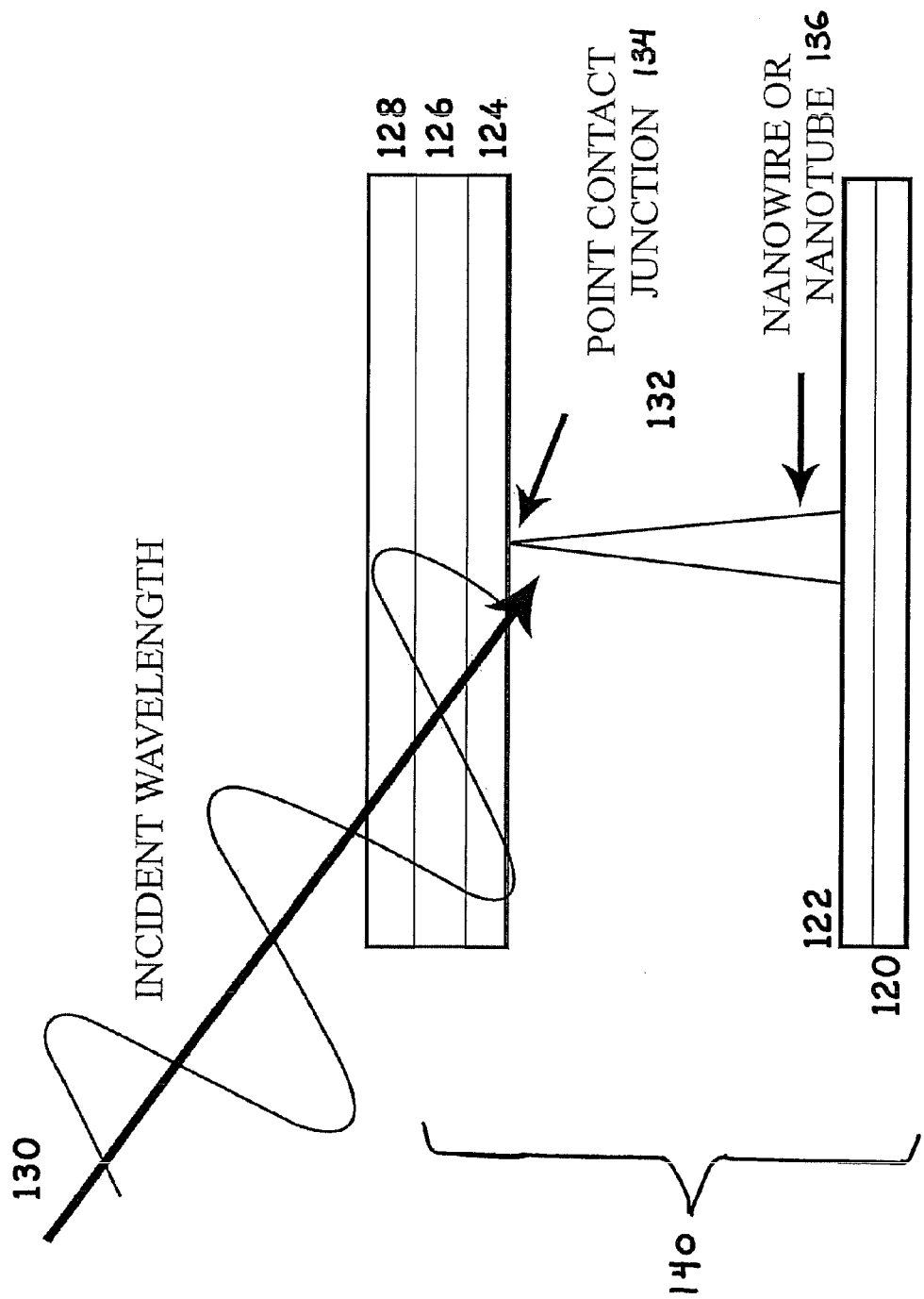
FIG. 6 is a diagram of the impact of the incident wavelength as it meets the point contact junction and where only one nanowire/mCNT is shown so as to simplify the view.

Turning next to FIG. 6, there is shown a high frequency rectifying device 1 receiving incident radiation 130 through a transparent cover layer 128. The transparent cover layer 128 is situated over at least one nanowire/mCNT-based high-frequency diode 140. The nanowire/mCNT-based high-frequency diode 140 includes nanowire/mCNT rectifying antennas 132 (instead of a planar MIM or MVM diode device) supported on metal electrode base 122 which is in layered contact with a substrate 120.

A nanowire/mCNT is in close proximity (on the order of about 1-10 nanometers) with a metal electrode 126 on one side to form a rectifying contact 134. The metal electrode layer 126 includes a transparent conductive layer, which may be made of indium-tin-oxide or any suitable transparent conductor. A thin insulating layer 124 lies between the metal electrode layer 126 and the nanowire/mCNT 132 and may be made up of any suitably appropriate electrically insulating layer, including a vacuum layer. The end of the nanowire/mCNT 132 at the contact area 134 is the sharp edge of the nanowire/mCNT 132, and forms a point-contact junction 134 with the insulating layer 124.

In another exemplary embodiment, the sharp edge may be a needle-like tip. In still another exemplary embodiment, the sharp edge may be a razor-like edge. And, in yet another exemplary embodiment, the sharp edge may be a circle such as the upper edge of a cylinder. The rectenna's sharp edge can be coated with materials such as diamond, BN, GaN, AlN, AlGaN and Cs. These coatings reduce the magnitude of the forward tunneling barrier allowing for enhanced electron emission.

The distance between adjacent nanowire/mCNTs 132 may be on the order of about 2 or 3 times the width of the incident wavelength, which for practical purposes is about 300-2000 nanometers; but, it is believed that the separation distance should be no more than on the order of about a few hundred nanometers to insure a viable collection efficiency.

Figure 7:
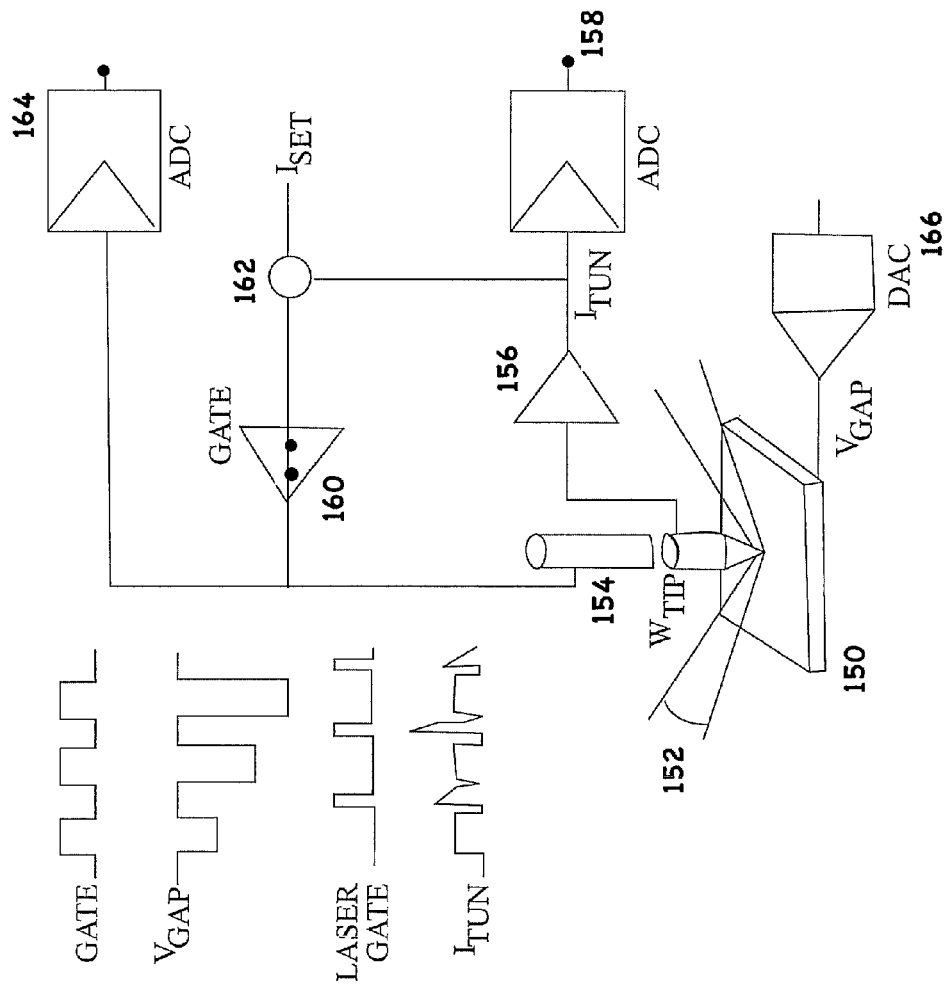
FIG. 7 is a modified circuit diagram of the conversion of the light energy at the tip of the antenna through the use of the rectification technique.

Turning next to FIG. 7 there is shown a modified circuit diagram of the conversion of the light energy at the tip of the antenna 154 through the use of the rectification technique. By making the contact area 152 as small as possible (on the order of about 50-200 nm$^2$) between the tip and the substrate 150, and using a low resistivity metal, such as, but not limited to, tungsten, molybdenum, nickel, gold or silver, for the edge, a point-contact diode rectifier is obtained with a response time in the optical region, corresponding to frequencies on the order of about 100-1000 THz. Rectification in a nanowire/mCNT point contact diode 140 may result from the geometric asymmetry of the diode structure as well as the utilization of dissimilar materials.

Nguyen et al. studied the rectification of incident radiation for a metallic whisker diode. The experiments of Nguyen et al. are of great significance since they obtained a rectified DC current from an IR irradiated tip. This experiment, described below, constitutes a first proof of principle.

This experiment in 1989 (see FIG. 7) determined the effective tunneling or transit time through an STM MVM junction barrier when irradiated with IR radiation[6]. In the experiment a rectified DC current of about 1 nA was measured, for $\lambda_{laser}$=1.06 μm, as a function of tip-collector spacing. The experimental results demonstrate the rectification of IR frequencies for appropriate tunnel gap spacing, d. If we assume an average tunneling velocity to be the Fermi velocity ($v_f$), then $v_{cutoff}$=$v_f$/d. This analysis predicts a 1 nm gap is capable of rectifying radiation approaching the UV.[6]

A sample-hold gate 160 is located between the feedback circuit, consisting of 164 and 166 which controls the tip-sample distance, and the STM junction. The tunneling current was also recorded automatically by a computer through a 12-bit analog-to-digital converter (ADC) 158. The measurement was made in a two-phase process. In the initial or sample phase, an applied bias between the antenna 154 and the substrate 150 and a reference current in the feedback circuit were used to set the tip-sample separation s. 162 is a circuit junction In FIG. 7, the gap distance is designed so that tunneling time is sufficient for the electrons to transit the barrier before field reversal. Nanowire/mCNTs 190, and other sharp-edged geometry devices, have an inherent fast response time (up to a fermo-second). AC currents at 166 are induced along the length of the antenna and produce oscillating charges at the top or edge of the geometrically asymmetric tunneling junction after transiting the gate 156. An oscillating charge in the tunnel junction induces an AC voltage across the gap. Due to geometric asymmetry there is a difference between the potential barriers for forward and reverse bias which results in rectification.

Figure 8:
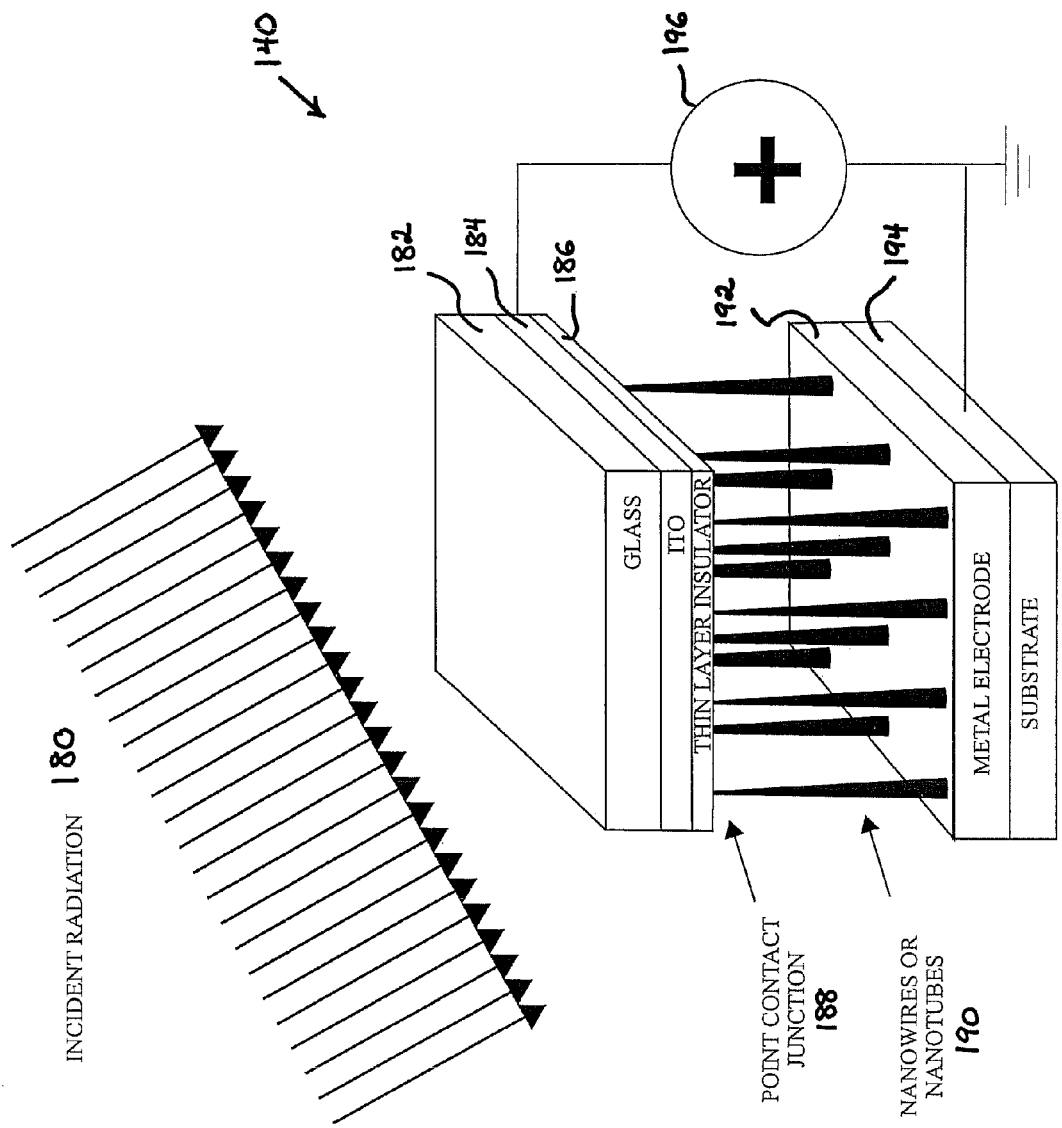
FIG. 8 is a modified relationship diagram of an incident of radiation being captured at the antenna utilizing the present invention and is shown with a plurality of nanowire/mCNTs and an external load.

Turning next to FIG. 8, there is shown the rectenna device 140 of the present invention as having a plurality of nanowire/mCNTs 190. In addition, FIG. 8 further shows an external load 196 connected to the rectenna 140 for utilizing and/or storing rectified DC current. The plurality of nanowires/mCNTs can be replaced by a plurality of patch antennas.

In FIGS. 6 and 8, as photons from incident radiation 130 reach the nanowire/mCNT 132, it absorbs the photons. In the infrared and optical regions, where the length of the point-contact nanowire/mCNT 132 is several wavelengths larger (on the order of about 1-10 wavelengths larger) than the incident radiation 130, the nanowire/mCNT 132 will act as an efficient antenna when the nanowire/mCNT is equal to an appropriate length, such as a quarter of the wavelength of the incident radiation.

Appropriate selection of the diode antenna length, electrical conductivity, optical reflectivity and load impedance may be used to improve the receiving properties of the high frequency diode, and to optimize the power absorption, and therefore the intensity of the current emission, or correspondingly, the output power in the rectenna 140. In the exemplary embodiment, a length of the nanowire 190 is ¼ of the wavelength of the incident radiation 180.

The energy absorbed by the nanowire/mCNT 190 causes electronic charge carriers to move to the sharp edge of the nanowire/mCNT 190, and this charge sets up an AC voltage in the nanowire/mCNT 190. As explained below, the geometric asymmetry of the point-contact junction 134 causes a rectification of the AC current passing through the tunneling junction 134. Once the current has been rectified, the transparent conductive layer 184 collects the rectified DC current. From this transparent conductive layer 184 (or anode), the DC current is coupled to an external load 196 to use and/or store the usable energy. In this manner, the metallic nanowire/mCNT acts as a receiving antenna to absorb the radiation, generating an alternating voltage in the nanowire/mCNT, which is then rectified in the point-contact junction 188 to create a DC voltage on the transparent conductive layer 184.

Metallic whisker antennae based tunneling diodes have been shown to have an extremely high frequency response (see Hung Quang Nguyen, *Experimental and Theoretical Studies of Tunneling Phenomena Using Scanning Tunneling Microscopy and Spectroscopy*, Ph.D. Thesis, available from Bell and Howell Information and Learning) (1989) (hereinafter referred to as Nguyen). This high frequency response is believed to be superior as compared to the lower frequency response of standard planar MIM diodes. Accordingly, these types have been adapted for use in the present high frequency optical rectification device of the present invention.

Unlike standard rectennas, the rectification process may be due solely or primarily to the geometrical asymmetry of the sharp CNT/nanowire edge. The rectification process can also be enhanced by material and temperature asymmetries, as discussed by A. Mayer, M. S. Chung, B. L. Weiss, N. M. Miskovsky, and Paul H. Cutler in *Three-Dimensional Analysis of the Geometrical Rectifying Properties of Metal-Vacuum-Metal Junctions and Extension for Energy Conversion*, Phys. Rev. B. 77, 085411 (Feb. 8, 2008) (hereinafter referred to as Mayer et A), which is incorporated herein by reference.

A factor in the efficiency of the nanowire/mCNT-based rectenna 140 is the ability to produce an induced current from the nanowire/mCNT 190 by minimizing the parasitic capacitance. This may be achieved through the point-contact junction 134, which causes a rectification of the AC current passing through the tunneling junction 134. When the nanowire/mCNT 190 contact area is very small, on the order of about 50-200 nm$^2$, the frequency response in the optical frequency region is improved relative to a planar MIM diode by two orders of magnitude, so that the device is able to convert the absorbed electromagnetic wave from the incident radiation 180 into DC current.

In the article by Krzysztof Kempa, Jakub Rybczynski, Zhongping Huang, Keith Gregorczyk, Andy Vidan, Brian Kimball, Joel Carlson, Glynda Benham, Yang Wang, Andrzej Herczynski, and Zhifeng Ren, *Carbon Nanotubes as Optical Antennae*, Adv. Mater. 19, 421-426 (2007), multi-walled CNTs having radii on the order of about 1-20 nanometers and having lengths on the order of about 1-10 microns are shown to have the properties of optical antennas.

In Mayer et al., it was predicted that similarly sized nanowires exhibit antenna and rectifier properties in the optical region.

Figure 9:
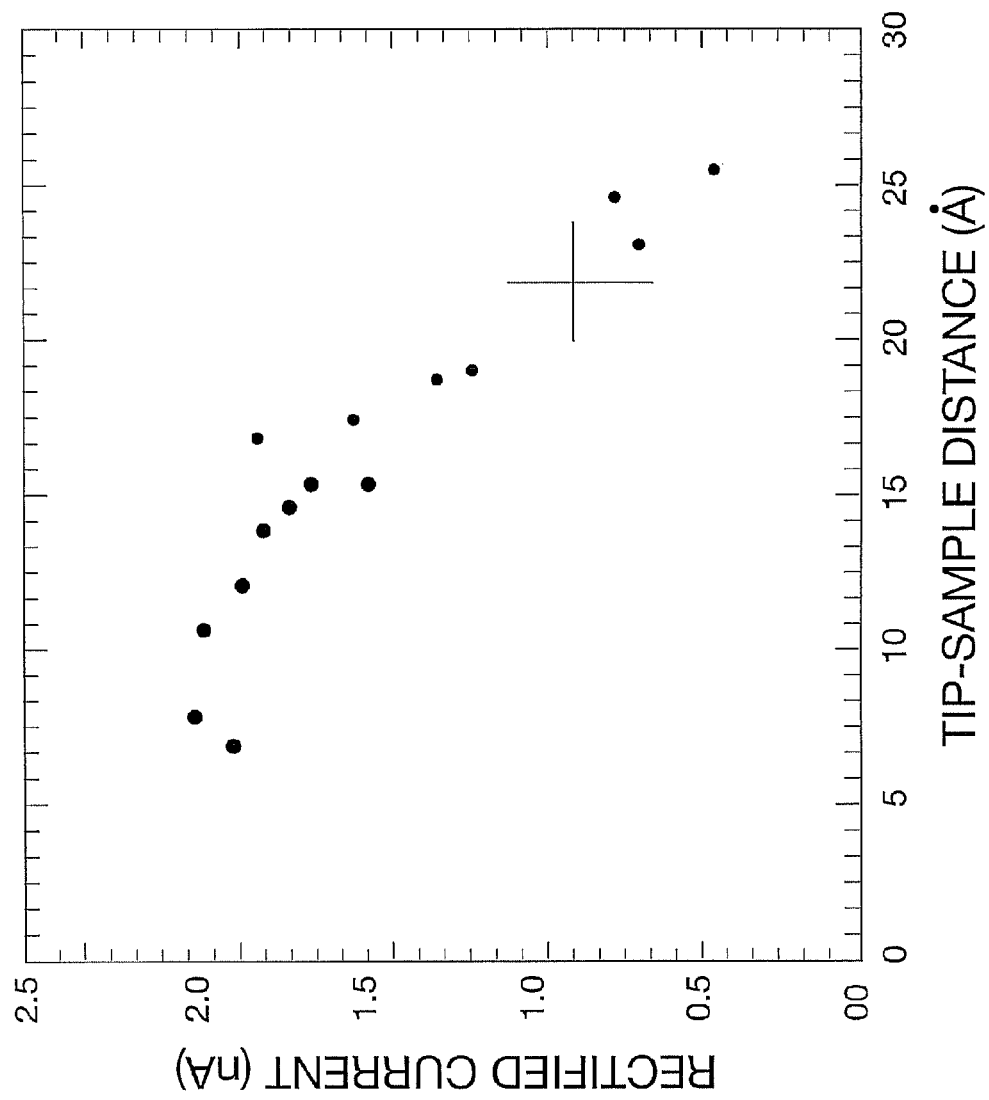
FIG. 9 is a point dispersion graph illustrating the relationship between the antenna tip sample distance and the rectified current generated at the tip.

FIG. 9 is a point dispersion graph illustrating the relationship between the antenna tip sample distance and the rectified current generated at the tip. This graph demonstrates the experimental results of rectification for different tip anode separations, and determines the limiting frequency response (see Nguyen).

Figure 10:
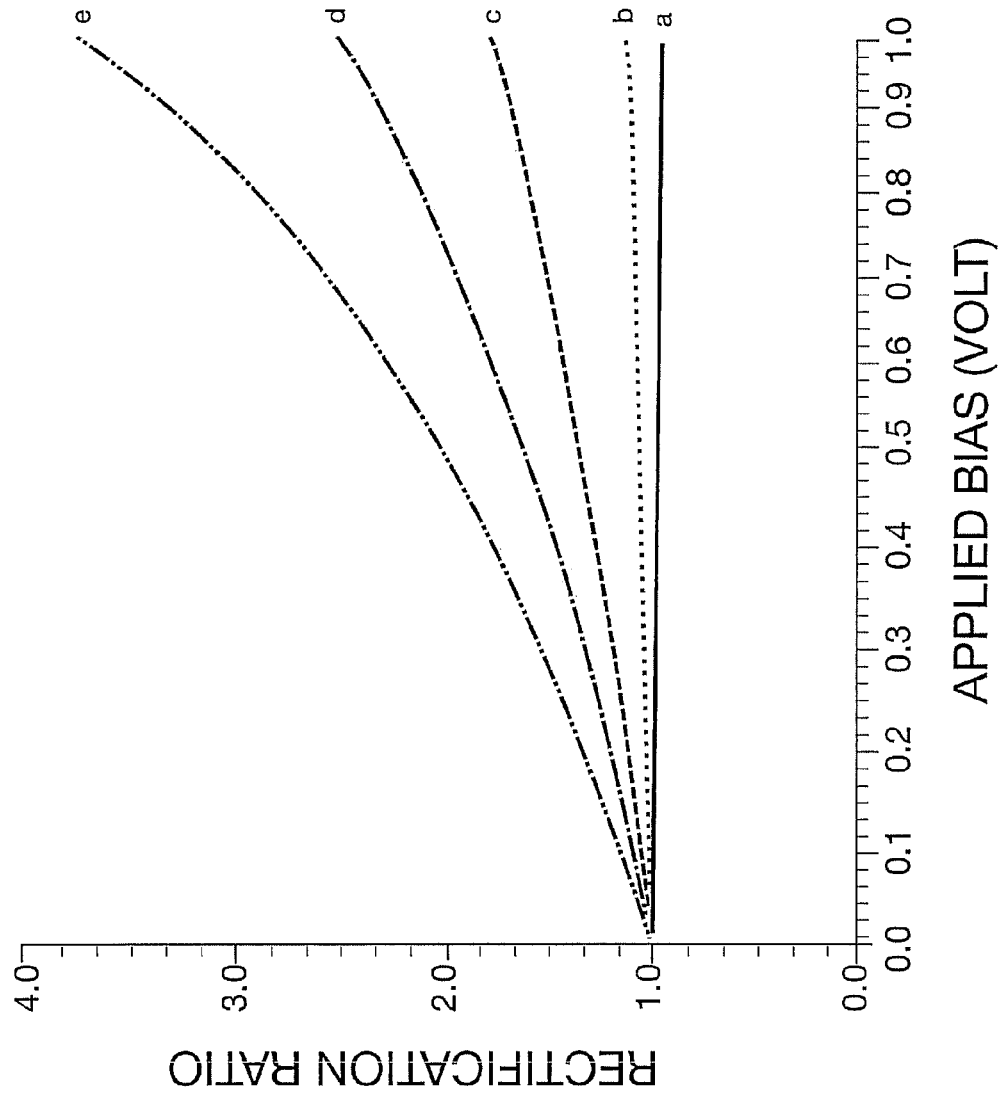
FIG. 10 is a graph of the effect of tip radius on the rectification ratios.

FIG. 10 is a graph of the effect of tip radius on the rectification ratios (see Nguyen). The calculations are done for: $\rho=\infty$, i.e., planar-planar junction, included as a reference (solid), (b) $\rho=10$ nm (dotted), (c) $\rho=2$ nm (dashed), (d) $\rho=1$ nm (dot-dashed). (e) $\rho=0.5$ nm (dot-dot dashed), and for the separation of 2 nm.

Turning then to FIG. 11, there is shown a schematic view of a point-contact nanowire/CNT(m) rectification device with incident radiation; and, FIG. 12 is a schematic view of a point-contact or sharp edged patch antenna 199 rectification device with incident radiation.

With respect to FIGS. 11 and 12, the rectenna device 140 has a plurality of nanowire/mCNTs 190. An external load 196 is connected to the rectenna 140 for utilizing and/or storing rectified DC current.

As photons from incident radiation 180 reach the nanowire/mCNT 190, it absorbs the photons. In the infrared and optical regions, where the length of the point-contact nanowire/mCNT 190 is several wavelengths larger (on the order of about 1-10 wavelengths larger) than the incident radiation 180, the nanowire/mCNT 190 will act as an efficient antenna when the nanowire/mCNT is equal to an appropriate length, such as a quarter of the wavelength of the incident radiation.

Appropriate selection of the diode antenna length, electrical conductivity, optical reflectivity and load impedance may be used to improve the receiving properties of the high frequency diode, and to optimize the power absorption, and therefore the intensity of the current emission, or correspondingly, the output power in the rectenna 140.

The energy absorbed by the nanowire/mCNT 190 causes electronic charge carriers to move to the sharp edge of the nanowire/mCNT 190, and this charge sets up an AC voltage in the nanowire/mCNT 190. The geometric asymmetry of the point-contact junction 188 causes a rectification of the AC current passing through the tunneling junction. Once the current has been rectified, the transparent conductive layer of the collector electrode 198 collects the rectified DC current. From the collector electrode 198, the DC current is coupled to an external load 196 to use and/or store the usable energy. In this manner, the metallic nanowire/mCNT 190 acts as a receiving antenna to absorb the radiation, generating an alternating voltage in the nanowire/mCNT 190, which is then rectified in the point-contact junction 188 to create a DC voltage.

In the claims, means or step-plus-function clauses are intended to cover the structures described or suggested herein as performing the recited function and not only structural equivalents but also equivalent structures. Thus, for example, although a nail, a screw, and a bolt may not be structural equivalents in that a nail relies on friction between a wooden part and a cylindrical surface, a screw's helical surface positively engages the wooden part, and a bolt's head and nut compress opposite sides of a wooden part, in the environment of fastening wooden parts, a nail, a screw, and a bolt may be readily understood by those skilled in the art as equivalent structures.

Having described at least one of the preferred embodiments of the present invention with reference to the accompanying drawings, it is to be understood that the invention is not limited to those precise embodiments, and that various changes, modifications, and adaptations may be effected therein by one skilled in the art without departing from the scope or spirit of the invention as defined in the appended claims.

What is claimed is:

1. A apparatus for receiving and converting incident radiation into DC current, said apparatus further comprising:
   (a) a substrate;
   (b) a first coating layered on said substrate and extending partway from a proximal edge of said substrate along the length of said substrate;
   (c) a first electrode layered on said first coating and extending partway from a proximal edge of said coating along the length of said coating;
   (d) a metallic antenna layered on said first coating and extending from a distal edge of said electrode and along and exceeding beyond a distal edge of said first coating;
   (e) a plasmon layer layered on said metallic antenna extending from a distal edge of said electrode and along and exceeding beyond a distal edge of said metallic antenna and extending downward at said distal end so as to cap said metallic antenna; and
   (f) a gap formed by the terminal ends of said Plasmon layer and said coating, said gap offsetting a second electrode and a second coating, wherein said second electrode is layered upon said second coating, and said second coating is layered upon said substrate.

2. The apparatus of claim 1, wherein said substrate is silicon.

3. The apparatus of claim 1, wherein said first coating is silicon oxide.

4. The apparatus of claim 1, wherein said second coating is silicon oxide.

5. The apparatus of claim 1, wherein said metallic antenna further comprises at least one point-contact diode, said at least one point-contact diode further comprising:
   (a) a conductor;
   (b) a nanowire, said nanowire providing a receiving antenna function and a rectification function, said nanowire further comprising:
      (i) a sharp edge, the nanowire tapering and being narrowest at the sharp edge;
      (ii) a thin insulating layer, situated between the transparent conductor and said nanowire; and
      (iii) a point-contact junction, at which said sharp edge contacts said thin insulating layer.

6. The apparatus of claim 5, wherein said sharp edge is a point.

7. The apparatus of claim 5, wherein said sharp edge is a line.

8. The apparatus of claim 5, wherein said sharp edge is a circle.

9. The apparatus of claim 5, wherein said point-contact junction further comprises a small contact area on the order of about 50 nm² to 200 nm².

10. The apparatus of claim 1, wherein said nanowire is made of a metal having a high absorption of radiation.

11. The apparatus of claim 1, wherein said nanowire is made of a metal having a low reflectivity of radiation.

12. The apparatus of claim 1, wherein said nanowire is made of a metal having a high conductivity.

13. The apparatus of claim 1, wherein said nanowire is made of a metal having a low resistivity.

14. The apparatus of claim 1, wherein said metal is selected from the group consisting of:
   (a) tungsten;
   (b) molybdenum;
   (c) nickel;
   (d) gold;
   (e) silver; and
   (f) copper.

15. The apparatus of claim 1, wherein the length of the nanowire is about ¼ of the wavelength of the incident radiation.

16. The apparatus of claim 1, wherein the length of the nanowire is about 1 to 10 times the wavelength of the incident radiation.

17. The apparatus of claim 1, wherein the nanowire is separated from adjacent nanowires by a distance that is on the order of about a wavelength of the incident radiation.

18. The apparatus of claim 1, wherein the nanowire is separated from adjacent nanowires by a distance that is on the order of about twice the wavelength of the incident radiation.

19. The apparatus of claim 1, wherein the nanowire is separated from adjacent nanowires by a distance that is on the order of about three times the wavelength of the incident radiation.

20. The apparatus of claim 1, wherein the thin insulating layer is a vacuum.

21. The apparatus of claim 1, further comprising: an external load for receiving and storing the DC current.

22. The apparatus of claim 1, wherein said at least one point-contact diode includes a plurality of point-contact diodes, each of said plurality of point-contact diodes having a nanowire providing a receiving antenna function and a rectification function, each of said nanowires including a sharp edge, and wherein each of said nanowires tapers and is narrowest at said sharp edge.

23. A method for receiving and converting incident radiation into DC current, said method comprising the steps of:
   (a) choosing an appropriate embodiment for an antenna having a terminal tip, said tip having a sharp edge, and said antenna capable of receiving said incident radiation;
   (b) layering said antenna so as to create said embodiment;
   (c) selecting a substrate;
   (b) first layering a first coating on said substrate so that said first coating extends partway from a proximal edge of said substrate along the length of said substrate;
   (c) second layering a first electrode on said first coating so as to extend partway from a proximal edge of said first coating along the length of said first coating;
   (d) third layering a metallic antenna on said first coating so as to extend from a distal edge of said first electrode and along and exceeding beyond a distal edge of said first coating;
   (e) fourth layering a plasmon layer on said metallic antenna so as to extend from a distal edge of said first electrode and along and exceed beyond a distal edge of said metallic antenna and extend downward at said distal end so as to cap said metallic antenna; and
   (f) forming a gap formed bounded by the terminal ends of said plasmon layer and said first coating, said gap offsetting a second electrode and a second coating, wherein said second electrode is layered upon said second coating, and said second coating is layered upon said substrate;
   (g) inducing a set of AC currents along the length of said antenna;
   (h) calculating whether or not said induced AC currents create voltages that are large enough for a field emission;
   (i) initiating a forward bias and a reverse bias based upon geometric asymmetry at said tip; and
   (j) delivering a positive net DC current to an external circuit.

24. The method of claim 23, wherein said antenna is a patch antenna.

25. The method of claim 23, wherein said antenna is a whisker antenna.

26. The method of claim 23, wherein said metal is selected from the group consisting of:
   (a) tungsten;
   (b) molybdenum;
   (c) nickel;
   (d) gold;
   (e) silver; and
   (f) copper.

* * * * *